US007362157B2

(12) United States Patent
Logiudice

(10) Patent No.: US 7,362,157 B2
(45) Date of Patent: Apr. 22, 2008

(54) CIRCUIT ARRANGEMENT WITH A TRANSISTOR HAVING A REDUCED REVERSE CURRENT

(75) Inventor: Andrea Logiudice, Padua (IT)

(73) Assignee: Infineon Technologies AG, Munich (DE)

( * ) Notice: Subject to any disclaimer, the term of this patent is extended or adjusted under 35 U.S.C. 154(b) by 36 days.

(21) Appl. No.: 11/375,607

(22) Filed: Mar. 14, 2006

(65) Prior Publication Data

US 2006/0208773 A1 Sep. 21, 2006

(30) Foreign Application Priority Data

Mar. 14, 2005 (DE) ...................... 10 2005 011 653

(51) Int. Cl.
*H03K 5/08* (2006.01)

(52) U.S. Cl. ...................... 327/318; 327/319; 327/320; 361/101

(58) Field of Classification Search ................ 327/309, 327/318, 319, 320; 361/101
See application file for complete search history.

(56) References Cited

U.S. PATENT DOCUMENTS 4,704,572 A * 11/1987 Melbert ...................... 323/275
4,945,444 A * 7/1990 Schwertlein et al. ........ 361/101
5,764,465 A * 6/1998 Mattes et al. ................. 361/77
6,104,168 A * 8/2000 Aranovich .................. 320/136
6,150,801 A 11/2000 Schwertlein et al.
6,424,512 B1 7/2002 Schmacht
2005/0017701 A1 1/2005 Hsu

FOREIGN PATENT DOCUMENTS

DE 197 39 246 A1 3/1999
DE 10 024 515 A1 11/2001
EP 0 374 288 B1 10/1994
EP 0 990 199 B1 11/2001

* cited by examiner

*Primary Examiner*—Kenneth B. Wells
(74) *Attorney, Agent, or Firm*—Maginot, Moore & Beck

(57) ABSTRACT

A circuit arrangement is disclosed herein having an input terminal configured to receive an input voltage, and an output terminal to provide an output voltage for a load. A first transistor with a load path and a control terminal is connected between the input terminal and output terminal. A first resistance element is connected between the control terminal of the first transistor and the input terminal. A first driver circuit is connected to the control terminal of the first transistor and is configured to control a current flow through the first transistor in a forward direction. A second driver circuit is provided which is designed to detect a voltage difference between the input terminal and output terminal, and then to drive this first transistor as a function of the voltage difference in a blocking action.

18 Claims, 3 Drawing Sheets

CIRCUIT ARRANGEMENT WITH A TRANSISTOR HAVING A REDUCED REVERSE CURRENT

FIELD OF THE INVENTION

The invention relates to a circuit arrangement with a transistor, and particularly to a circuit arrangement providing a reduced reverse current in the transistor.

BACKGROUND

FIG. 1 shows a circuit comprising an input terminal and an output terminal, a transistor having a load path and a control terminal, the load path of which is connected between the input terminal and output terminal, and a driver circuit which is connected to the control terminal of the transistor. A circuit arrangement of this type is described, for example, in EP 0 990 199 B1 as well as FIG. 1. This circuit arrangement has an input terminal IN to apply an input voltage Vin, an output terminal OUT to supply an output voltage Vout for a load Cout, and a bipolar transistor Q11 interconnected between input and output terminals IN, OUT. To drive transistor Q11, there is a driver circuit which is connected to the base terminal of transistor Q11.

A circuit arrangement of this type finds application, for example, in voltage regulators which supply a regulated output voltage at the output terminal from an input voltage applied at the input terminal, or in current regulators which supply a predefined current from the input terminal to the output terminal.

In this arrangement, the current from the input terminal to the output terminal IN, OUT, is controlled by the driver circuit 3 through the base current of transistor Q11. In a voltage regulator; driver circuit 3 is designed to control the base current of transistor Q11 as a function of the output voltage Vout applied at the output terminal—as described, for example, in the above-mentioned EP 0 990 199 B1. In a current regulator, the driver circuit controls the base current as a function of the current which flows from the input terminal to the output terminal.

In FIG. 1, the circuit arrangement with capacitive load Cout is wired to output terminal OUT of the load. The input voltage is supplied, for example, by a battery, not shown here. A resistance connected between input terminal IN and the base of the transistor prevents, in a known manner, the transistor to turn on at high temperatures due to leakage currents. Such resistors are known as "anti leakage" resistors.

In a circuit of this type, problems can occur when the input voltage Vin drops below the value of the output voltage Vout. Transistor Q11 then operates in the reverse direction, that is, a current I11 flows from the output to the input terminal OUT, IN. This "reverse current" I11 is a function of the voltage difference Vdiff between the terminals—the resistance value of resistance R11 and the current amplification factor of transistor Q11. The applicable equation for the reverse current is:

$$I11 = iB11 \cdot (\beta inv + 1) = (Vdiff - Vth\_inv)/R11 \cdot (\beta inv + 1) \quad (1)$$

Here, iB11 denotes the base current flowing through resistance R11, Vdiff denotes the difference between output and input voltage Vout, Vin, and βinv denotes the current amplification of the transistor for operation in the reverse direction. Vth_inv denotes the threshold voltage of transistor Q11 operated in the reverse direction.

For applications in which the output capacitor Cout is supposed to store its charge for as long as possible in response to a loss or turn-off of input voltage Vin, this reverse current I11 is undesirable.

To reduce the reverse current, an approach is known from EP a 374 288 B1 in which, in addition to the first transistor connected between the input terminal and output terminal, a second transistor is provided which together with the first transistor forms a current mirror.

A circuit arrangement of this type is illustrated in FIG. 2. The second transistor in FIG. 2 is identified as Q12. This transistor Q12 is interconnected as a diode, and is connected between the output terminal OUT and the base of first transistor Q11.

For this circuit, the applicable equation for reverse current I11 is:

$$I11 = I12 \cdot (k+1) = (Vdiff - Vth12)/R11 \cdot k \quad (2).$$

Here Vth12 denotes the threshold voltage of second transistor Q12, while k denotes the current mirror factor between the two transistors Q12 and Q11. This current mirror factor k can be set such than it is smaller that the current amplification Binv of first transistor Q11, with the result that a smaller reverse current is produced in comparison with the circuit of FIG. 1.

Therefore, it would be advantageous to provide a circuit arrangement with a transistor connected between an input terminal and an output terminal, which transistor has a reduced reverse current in response to a drop in the input voltage below the value of the output voltage.

SUMMARY

As disclosed herein, a circuit arrangement has an input terminal to apply an input voltage, an output terminal to supply an output voltage for a load, a first transistor with a load path and a control terminal. The load path of the first transistor is connected here between the input terminal and output terminal. In addition, the circuit arrangement comprises a first resistance element, which is connected between the control terminal of the first transistor and the input terminal, and a first driver circuit which is connected to the control terminal of the first transistor and is designed to control a current flow through the first transistor in a forward direction. In addition, a second driver circuit is provided which is designed to detect a voltage difference between the input terminal and output terminal, and then to drive this first transistor as a function of the voltage difference in a blocking action.

This second driver circuit which drives in a blocking action the first transistor as a function of the voltage difference between the input terminal and output terminal brings about a significant reduction in the reverse current in comparison with conventional circuit arrangements of this type.

The second driver circuit is designed, for example, to short the control terminal of the first transistor to a load terminal of this first transistor, which is connected to the output terminal, in order to drive the first transistor in a blocking action.

In the Figures, unless otherwise indicated, the same reference notations refer to the same components and signals with the same meaning.

DESCRIPTION

Figure 3:
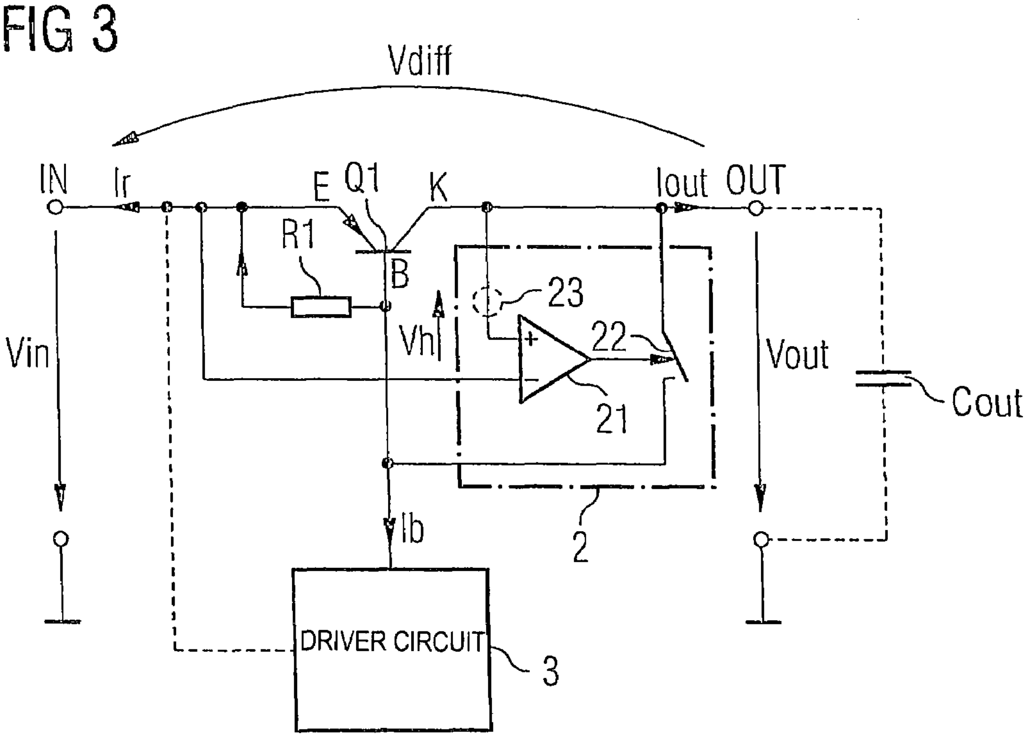
FIG. 3 shows a circuit arrangement including a transistor connected between an input terminal and output terminal, and a driver circuit to drive in a blocking action the first transistor as a function of the voltage difference between the input terminal and output terminal.

With reference to FIG. 3, a driver circuit has an input terminal IN to apply an input voltage Vin, and an output terminal OUT to supply an output voltage Vout for a load. The load in FIG. 3 is shown as a capacitive load Cout indicated by a broken line. The input and output voltages Vin, Vout are referenced to the same potential, for example, ground.

The load path of the first transistor Q1 is connected between input terminal IN and output terminal OUT. In the example, this transistor Q1 is designed as a pnp bipolar transistor, the emitter-collector path of which forms the load path. The emitter terminal of this transistor Q1 is connected here to input terminal IN, while the collector terminal K of this first transistor Q1 is connected to output terminal OUT. To drive this first transistor Q1, a first driver circuit 3 is provided which is connected to the base terminal B, forming the control terminal, of first transistor Q1.

Normal operation of this circuit arrangement occurs whenever input voltage Vin is greater than or equal to output voltage Vout. The current flow through first transistor Q1 from input terminal IN to output terminal OUT here is controlled by first driver circuit 3 through a base current Ib of first transistor Q1. First driver circuit 3 can be a driver circuit conventionally used in such circuit arrangements. This first driver circuit 3 can be designed, for example, to generate, in an approach not further detailed here, base current Ib of first transistor Q1 as a function of an output voltage Vout, in order thereby to generate a constant output voltage Vout. In an approach not further detailed here, first driver circuit 3 could also be designed to generate base current Ib of first transistor Q1 as a function of a current flow from input terminal to output terminal IN, OUT, in order thereby to control the current flow and, for example, generate a constant output current Iout.

In the fundamentally known approach, a first resistor R1 is connected between the base terminal B and emitter terminal E of first transistor Q1, the resistor serving to reduce leakage currents.

In addition to the above-described normal state in which input voltage Vin is greater than output voltage Vout, and in which output current Iout flows in the direction shown in FIG. 3 from input terminal IN to output terminal OUT, a second operational state can occur in the circuit arrangement shown in which output voltage Vout is greater than input voltage Vin. This state occurs at such times, for example, when input voltage Vin drops, either intentionally or unintentionally, and whenever capacitive load Cout is connected to output terminal OUT through which output voltage Vout continues to be applied even after input voltage Vin is turned off. In order to keep the current flow from output terminal OUT to input terminal IN during this second operational state as low as possible, a second driver circuit 2 is provided which is connected to base terminal B of first transistor Q1 and which is designed to detect a voltage difference Vdiff between input terminal IN and output terminal OUT, and to drive in a blocking action first transistor Q1 as a function of this voltage difference Vdiff.

In the example of FIG. 3, this second driver circuit 2 has a comparator 21 and a switching element 22 driven by comparator 21.

A first input of the comparator here is connected to output terminal OUT or the collector terminal of first transistor Q1, while a second input of comparator 21 is connected to input terminal IN or the emitter terminal of first transistor Q1. Switching element 22, driven by the comparator, is connected between collector terminal K of first transistor Q1 and the base terminal B of the transistor.

The following discussion explains the functional principle of this second driver circuit 2:

When the output voltage exceeds the value of input voltage Vin, comparator 21 drives switching element 22 conductively in order to short collector K and base B of first transistor Q1, thereby preventing conductive driving of first transistor Q1 in the reverse direction. In this circuit as well, a reverse current Ir flows from output terminal OUT to input terminal IN, that is, through conductively driven switching element 22 and resistance R1 of first transistor Q1 connected between the base B and the emitter E. However, this current is significantly smaller than in known circuit arrangements and is defined simply by:

$$IR = \mathrm{Vdiff}/R1 \qquad (3),$$

where R1 denotes the resistance value of the resistance connected between base and emitter of first transistor Q1.

Figure 1:
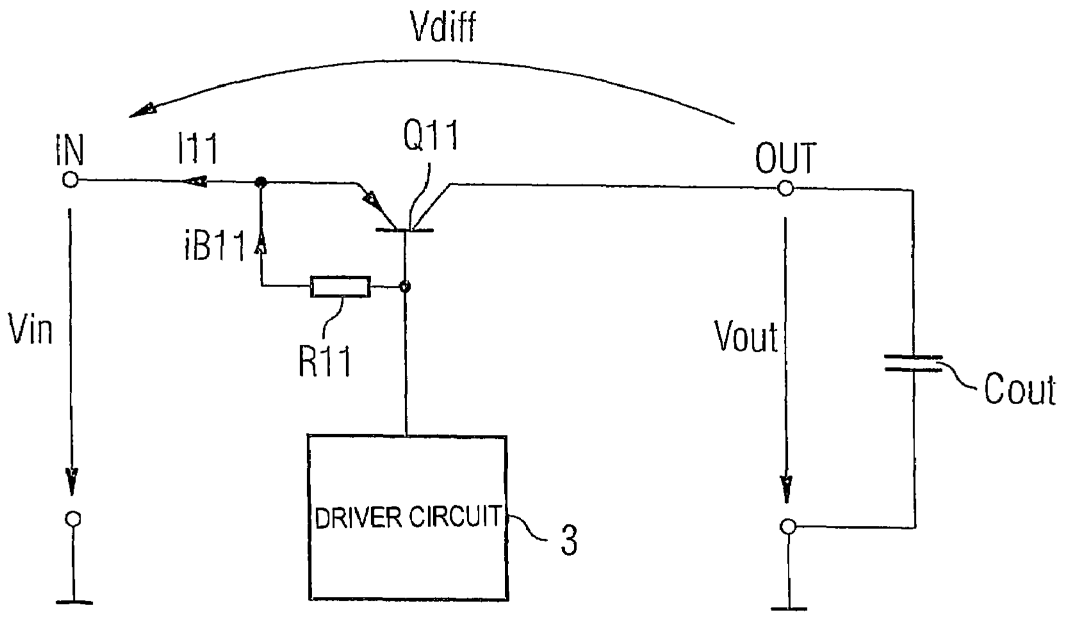
FIG 1 Prior art
FIG. 1 shows a first circuit arrangement according to the prior art.
Figure 2:
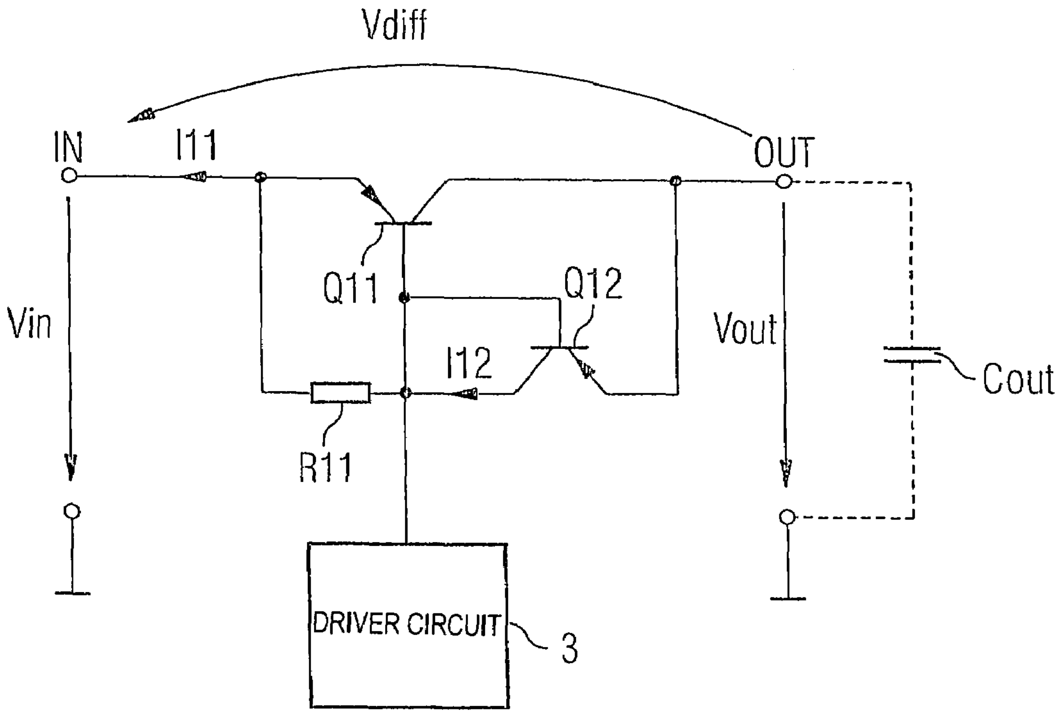
FIG 2 Prior art
FIG. 2 shows a second circuit arrangement according to the prior art.

This reverse current Ir is thus smaller by roughly a factor βinv+1 than reverse current I11 in the circuit arrangement of FIG. 1, and roughly by a factor k smaller than in the circuit arrangement of FIG. 2. In contrast to the situation in the known circuit arrangements, in the circuit arrangement of FIG. 3 current flow is prevented through the load path of first transistor Q1 connected between input terminal and output terminal IN, OUT.

In order to be able to shift the voltage difference between output voltage Vout and input voltage Vin, in which comparator 21 conductively drives switching element 22, towards values greater than zero, an auxiliary voltage source 23 is optionally provided which is connected on the incoming side of one of the inputs of comparator 21. In this example, this auxiliary voltage source 23 is connected on the incoming side of the first input of comparator 21 and supplies an auxiliary voltage Vh with the polarity shown. In this example, conductive driving of switching element 22 occurs whenever output voltage Vout exceeds the value of input voltage Vin by the value of the auxiliary voltage Vh. Auxiliary voltage source 23 could also be connected on the incoming side of the second input of comparator 21; however, in this case the polarity of the auxiliary voltage source would have to be reversed.

Figure 4:
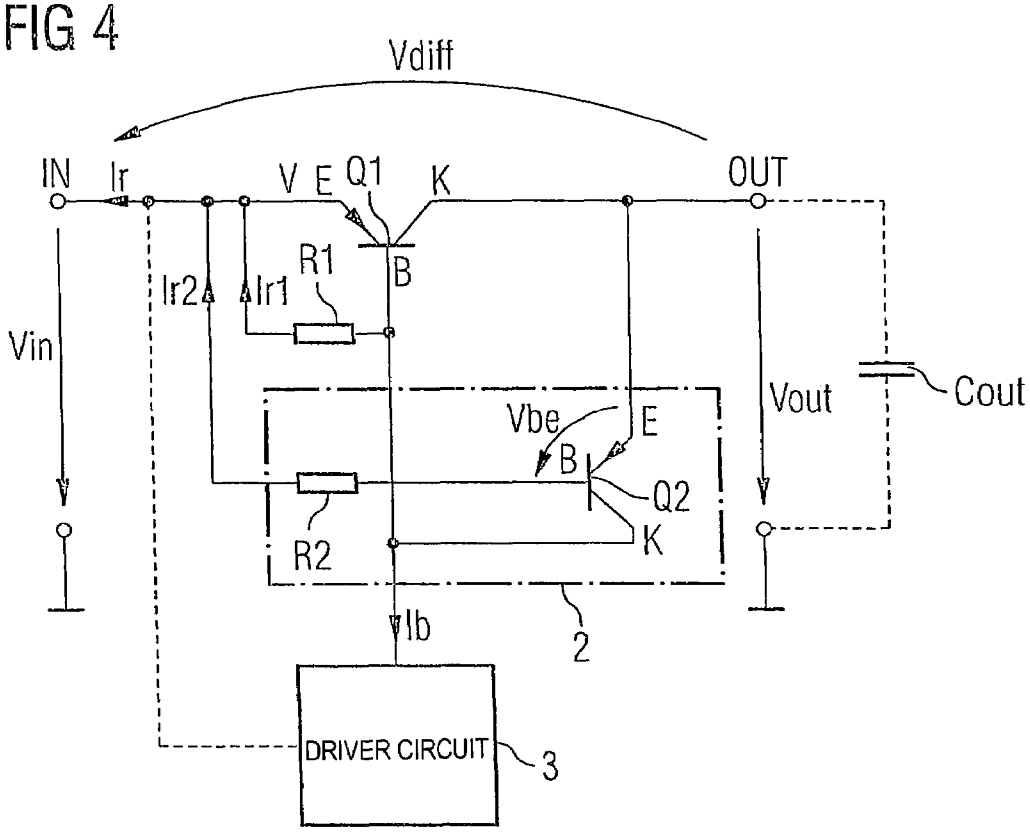
FIG. 4 shows a circuit arrangement according to the invention including a driver circuit that can be implemented in an especially simple manner.

FIG. 4 shows an example of second driver circuit 2 that is simple to implement. In this example, second driver circuit 2 has a second transistor Q2 which is designed as a pnp bipolar transistor and whose load path (emitter-collector path) is connected between the collector terminal K of first transistor Q1 and the base terminal B of the transistor. A base terminal of this second transistor Q2 is driven by input voltage Vin through a series resistance R2.

In this second driver circuit 2, second transistor Q2 performs both the function of a comparator as well as the function of a switching element. In this circuit arrangement, whenever output voltage Vout exceeds input voltage Vin by a voltage value corresponding to the threshold value of second transistor Q2, this second transistor Q2 is driven conductively so as to short base Band collector K of first transistor Q1. The voltage applied through the collector-emitter path of conductively driven second transistor Q2 is not sufficient to drive first transistor Q1, with the result that first transistor Q1 is blocked during this operational state.

In this example as well, a small reverse current flows during the second operational state, which current is composed of the base current of second transistor Q2 and the load path current or collector current of this second transistor Q2. The collector current of this second and third transistor Q2 flows through first resistance R1 connected between base and emitter B, E, of first transistor Q1.

The applicable equation for reverse current Ir is:

$$Ir=Ir1+Ir2=(\text{Vdiff}-Vth2)/R2+(\text{Vdiff}-Vcesat2)/R1 \quad (4).$$

Vth2 here denotes the threshold voltage of second transistor Q2, while Vcesat2 denotes the load path voltage of second transistor Q2 in the switched-on state.

If one assumes as typical numerical values for the resistances R1=R2=300 kΩ for the voltage difference Vdiff=10V, the threshold voltage Vth2=0.7V, and the load path voltage Vcesat2=0.3V, then the applicable equation for reverse current IR is:

$$Ir=(10\text{V}-0.7\text{V})/300\ \text{k}\Omega+(10\text{V}-0.3\text{V})/300\ \text{k}\Omega=63\ \mu\text{A} \quad (4a).$$

This reverse current is significantly smaller than in the circuit arrangements of FIGS. 1 and 2. For R11=300 kΩ and a usual reverse amplification of Binv=47, the reverse current I11 obtained in the circuit of FIG. 1 using equation (1) is:

$$I11=(10\text{V}-0.7\text{V})/300\ \text{k}\Omega\cdot 47=1.49\ \text{mA} \quad (1a)$$

Given corresponding numerical values for voltage difference Vdiff and first resistance R11, the reverse current obtained for the circuit arrangement of FIG. 2, using equation (2) is:

$$I11=(10\text{V}-0.7\text{V})/300\ \text{k}\Omega\cdot 30=930\ \mu\text{A} \quad (2b),$$

when the assumed mirror ratio is k=30.

In the above embodiments to determine the reverse current Ir in the circuit arrangements according to the invention as shown in FIGS. 3 and 4, it was assumed that the base current Ib flowing into first driver circuit 3 is zero during the second operational state.

Figure 5:
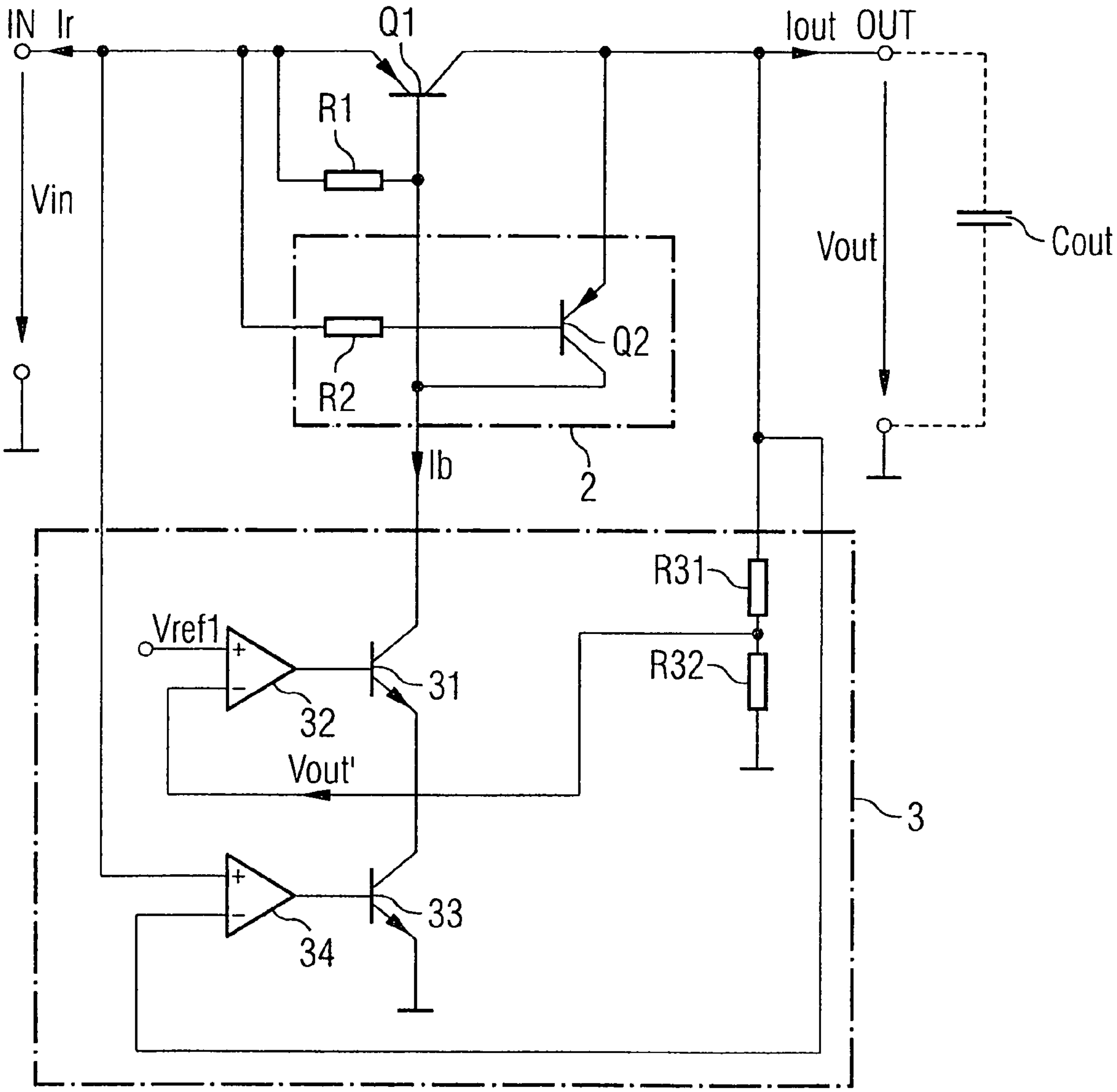
FIG. 5 shows a driver circuit according to the invention including a possible embodiment of a first driver circuit driving the first transistor during normal operation.

FIG. 5 shows a circuit-engineering embodiment for a first driver circuit 3 in which this condition is ensured.

This first driver circuit 3 is fundamentally designed to adjust base current Ib of first transistor Q1 as a function of output voltage Vout so as to obtain a constant output voltage Vout through a capacitive load Cout The first driver circuit has a voltage divider R31, R32 connected to output terminal OUT on which a divided output voltage Vout' is supplied which is then fed to a differential amplifier 32. Differential amplifier 32 compares the divided output voltage Vout' with a first reference voltage Vref1 and drives a regulating transistor 31 which is connected between base terminal B of first transistor Q1 and a reference potential GND.

Connected in series to this regulating transistor 31 is an additional transistor 33 acting as a switch which is driven by another differential amplifier 34. The inputs of this differential amplifier 34 are connected to input terminal IN and output terminal OUT. This differential amplifier 34 and the additional transistor 33 are matched to each other in such a way that transistor 33 is conductively driven only when input voltage Vin is greater than output voltage Vout. Whenever output voltage Vout exceeds input voltage Vin, additional transistor 33 performs a blocking action, thereby preventing the generation of base current Ib for first transistor Q1.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A circuit arrangement comprising:
- a circuit input;
- a circuit output;
- a first transistor including a load path and a control terminal, wherein the load path is connected between the circuit input and the circuit output;
- a path connected between the control terminal of the first transistor and the circuit input;
- a first driver circuit connected to the control terminal of the first transistor, wherein the first driver circuit is designed to control a current flow through the first transistor;
- a second driver circuit configured to detect a voltage difference between the circuit input and the circuit output, wherein the second driver circuit is further configured to drive the first transistor in a blocking action as a function of the voltage difference, the second driver circuit including a comparator having a first comparator input connected to the circuit output, and a second input connected to the circuit input; and
- a controllable switching element connected between the control terminal of the first transistor and the first load terminal of the first transistor, wherein the controllable switching element is driven by the comparator.

2. The circuit arrangement of claim 1 wherein the path connected between the control terminal of the first transistor and the circuit input comprises a first resistance element.

3. The circuit arrangement of claim 1 wherein the second driver circuit is designed to drive the first transistor in a blocking action whenever the output voltage exceeds the input voltage.

4. The circuit arrangement of claim 1 wherein the second driver circuit is configured to, as a function of the voltage difference, short the control terminal of the first transistor to a first load terminal of the first transistor, said first load terminal being connected to the circuit output.

5. The circuit arrangement of claim 4 wherein the second driver circuit comprises a second transistor having a control terminal and a load path, wherein the load path of the second transistor is connected between the control terminal of the first transistor and the first load terminal of the first transistor, and wherein the control terminal of the second transistor is connected to the circuit input.

6. The circuit arrangement of claim 5 wherein the control terminal of the second transistor is connected to the circuit input through a second resistance element.

7. The circuit arrangement of claim 1 wherein the first transistor is a pnp bipolar transistor.

8. The circuit arrangement of claim 7 wherein the second transistor is a pnp bipolar transistor.

9. A circuit arrangement comprising:

a circuit input;

a circuit output;

a first transistor connected between the circuit input and the circuit output, the first transistor including a load path and a control terminal;

a path between the control terminal of the first transistor and the circuit input;

a first driver circuit connected to the control terminal of the first transistor, wherein the first driver circuit is configured to control a current flow through the first transistor;

a second driver circuit configured to detect a voltage difference between the circuit input and the circuit output, wherein the second driver circuit is further configured to prevent current flow through the load path of the first transistor based on the voltage difference, the second driver circuit including a comparator having a first comparator input connected to the circuit output, and a second input connected to the circuit input; and a controllable switching element connected between the control terminal of the first transistor and the first load terminal of the first transistor, wherein the controllable switching element is driven by the comparator.

10. The circuit arrangement of claim 9 wherein the circuit input is configured to provide an input voltage, the circuit output is configured to provide an output voltage, and the second driver circuit is configured to prevent current flow through the load path of the first transistor when the output voltage is greater than the input voltage.

11. The circuit arrangement of claim 9 wherein the path between the control terminal of the first transistor and the circuit input includes a first resistive element.

12. The circuit arrangement of claim 9 wherein the second driver circuit is configured to, as a function of the voltage difference, short the control terminal of the first transistor to a first load terminal of the first transistor, said first load terminal being connected to the circuit output.

13. The circuit arrangement of claim 12 wherein the second driver circuit comprises a second transistor having a control terminal and a load path, wherein the load path of the second transistor is connected between the control terminal of the first transistor and the first load terminal of the first transistor, and wherein the control terminal of the second transistor is connected to the circuit input.

14. The circuit arrangement of claim 13 wherein the control terminal of the second transistor is connected to the circuit input through a second resistance element.

15. The circuit arrangement of claim 9 wherein the first transistor is a pnp bipolar transistor.

16. The circuit arrangement of claim 9 wherein the second transistor is a pnp bipolar transistor.

17. A circuit arrangement comprising:

an input terminal configured to provide an input voltage;

an output terminal configured to provide an output voltage;

a first transistor including a control terminal and a load path connected between the input terminal and the output terminal;

a first resistance element connected between the control terminal of the first transistor and the input terminal;

a first driver circuit connected to the control terminal of the first transistor, wherein the first driver circuit is configured to control a current flow through the first transistor in a forward direction; and means for blocking current flow through the load path of the first transistor based on a difference between the input voltage and the output voltage, said means for blocking including means for comparing the input voltage and the output voltage and generating a comparator output based the comparison, said means for blocking further including a controllable switching element connected between the control terminal of the first transistor and the first load terminal of the first transistor, wherein the controllable switching element is driven by the comparator output.

18. The circuit arrangement of claim 17 wherein the means for blocking blocks current flow through the load path of the first transistor when the output voltage exceeds the input voltage.

* * * * *